United States Patent
Di Cioccio et al.

(10) Patent No.: US 9,620,412 B2
(45) Date of Patent: Apr. 11, 2017

(54) METHOD FOR MODIFYING THE CRYSTALLINE STRUCTURE OF A COPPER ELEMENT

(75) Inventors: Lea Di Cioccio, Saint Ismer (FR); Pierric Gueguen, Echirolles (FR); Maurice Rivoire, Meylan (FR)

(73) Assignees: Commissariat à l'énergie atomique et aux énergies alternatives, Paris (FR); STMICROELECTRONICS (CROLLES 2) SAS, Crolles (FR)

(*) Notice: Subject to any disclaimer, the term of this patent is extended or adjusted under 35 U.S.C. 154(b) by 1266 days.

(21) Appl. No.: 13/380,633

(22) PCT Filed: Jul. 1, 2010

(86) PCT No.: PCT/EP2010/059336
§ 371 (c)(1),
(2), (4) Date: Dec. 23, 2011

(87) PCT Pub. No.: WO2011/000899
PCT Pub. Date: Jan. 6, 2011

(65) Prior Publication Data
US 2012/0097296 A1 Apr. 26, 2012

(30) Foreign Application Priority Data
Jul. 3, 2009 (FR) ..................... 09 54610

(51) Int. Cl.
*C22F 1/08* (2006.01)
*H01L 21/321* (2006.01)
(Continued)

(52) U.S. Cl.
CPC ...... *H01L 21/76886* (2013.01); *H01L 21/321* (2013.01); *H01L 21/3212* (2013.01);
(Continued)

(58) Field of Classification Search
CPC ................. C22F 1/08; H01L 21/31051; H01L 21/31053; H01L 21/321; H01L 21/32115;
(Continued)

(56) References Cited

U.S. PATENT DOCUMENTS

2005/0003650 A1 1/2005 Ramanathan et al.
2005/0003652 A1 1/2005 Ramanathan et al.
(Continued)

FOREIGN PATENT DOCUMENTS

JP 10-321621 A 12/1998
JP 2007-281485 A 10/2007
(Continued)

OTHER PUBLICATIONS

Gueguen, Pierric, Léa Di Cioccio, Patrice Gergaud, Maurice Rivoire, Daniel Scevola, Marc Zussy, Anne Marie Charvet, Laurent Bally, Dominique Lafond, and Laurent Clavelier. "Copper Direct Bonding Characterization and Its Interests for 3D Integration Circuits." ECS Transactions (2008).*

(Continued)

*Primary Examiner* — Jessee Roe
*Assistant Examiner* — Anthony Liang
(74) *Attorney, Agent, or Firm* — Oblon, McClelland, Maier & Neustadt, L.L.P.

(57) ABSTRACT

A method for modifying crystalline structure of a copper element with a planar surface, including: a) producing a copper standard having large grains, wherein the standard includes a planar surface, b) reducing roughness of the planar surfaces to a roughness of less than 1 nm, c) cleaning the planar surfaces, d) bringing the two planar surfaces into contact, and e) annealing.

11 Claims, 3 Drawing Sheets

Figure 1A:
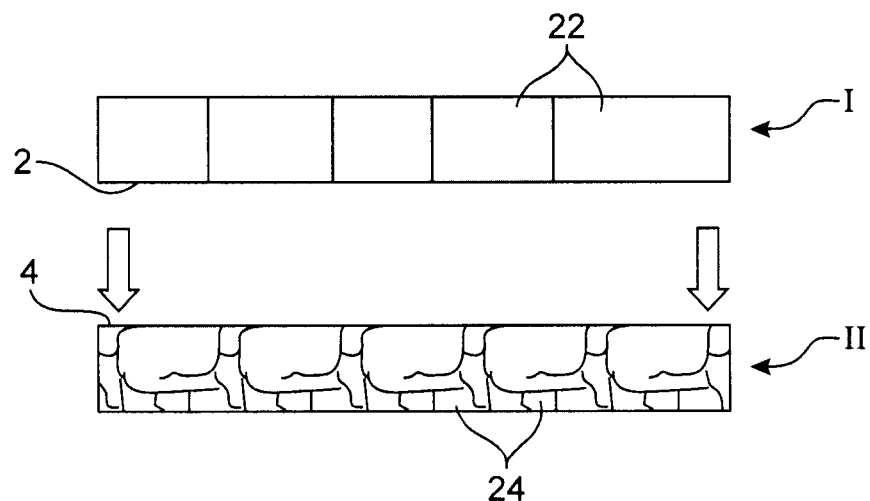

(51) Int. Cl.
*H01L 21/768* (2006.01)
*H01L 21/3105* (2006.01)

(52) U.S. Cl.
CPC .... *H01L 21/7684* (2013.01); *H01L 21/76883* (2013.01); *H01L 21/31053* (2013.01)

(58) Field of Classification Search
CPC ............. H01L 21/3212; H01L 21/7684; H01L 21/76883; H01L 21/76886
See application file for complete search history.

(56) References Cited

U.S. PATENT DOCUMENTS

| | | |
|---|---|---|
| 2007/0238294 A1 | 10/2007 | Beyer et al. |
| 2009/0035936 A1 | 2/2009 | Boemmels et al. |
| 2009/0102051 A1 | 4/2009 | Beyer et al. |
| 2009/0174070 A1 | 7/2009 | Ramanathan et al. |

FOREIGN PATENT DOCUMENTS

| | | |
|---|---|---|
| JP | 2009-505401 A | 2/2009 |
| WO | WO 2007/020939 A1 | 2/2007 |
| WO | WO 2007/021639 A2 | 2/2007 |

OTHER PUBLICATIONS

Preliminary Search Report issued Feb. 8, 2010 in French Patent Application No. 0954610 with English translation of categories of cited documents.

Pierric Gueguen, et al., "3D Vertical Interconnects by Copper Direct Bonding", Mater Res. Soc. Symp. Proc., vol. 1112, 2009, 9 pages.

U.S. Appl. No. 13/380,595, filed Dec. 23, 2011, Di Cioccio et al.

International Search Report and Written Opinion issued Oct. 14, 2010, in PCT/EP2010/059336 with English translation of category of cited documents.

Office Action issued Mar. 31, 2014 in Japanese Patent Application No. 2012-516792 (with English language translation).

U.S. Appl. No. 13/811,498, filed May 1, 2013, Di Cioccio et al.

\* cited by examiner

METHOD FOR MODIFYING THE CRYSTALLINE STRUCTURE OF A COPPER ELEMENT

TECHNICAL FIELD AND PRIOR ART

The present invention relates to a method for modifying the crystalline structure of copper elements, and more specifically copper connections used in microelectronic devices.

Copper has very high electrical conductivity, and is therefore commonly used to make connections in microelectronic devices.

Electrical conductivity depends, among other factors, on the crystallography of the connection, and more specifically on the orientation of the dense planes relative to the current's direction. Indeed, conduction in a direction perpendicular to the dense planes is much lower than that in the direction of the planes. In addition, the presence of grain boundaries causes an increase of resistivity, and it is therefore preferable to reduce their numbers, by making large-grain connection lines.

But it is relatively difficult to make monocrystalline contact lines directly, or to make contact lines with large grains directly, due to their small size. Similarly, obtaining a given orientation of the dense planes in an electrical connection directly during deposit is complex.

A known technique to increase the size of the grains is to undertake an annealing at a temperature close to the fusion temperature. In the case of copper, the annealing should be undertaken at a temperature of the order of 900° C. However, in the special case of microelectronic structures, this temperature cannot exceed 400° C., in order to protect the microelectronic structure. The annealing must therefore be of substantial duration.

It is, consequently, one aim of the present invention to provide a method enabling the crystallographic characteristics of copper connection elements to be modified, and in particular such elements as are used in microelectronic devices.

ACCOUNT OF THE INVENTION

The aim set out above is achieved through a method of modifying the crystalline structure intended to modify the crystalline structure of a copper element after it is produced, by bringing the element to be modified into contact with a copper element having the desired crystallographic characteristics.

The contact method is of the adherent type, also designated direct bonding or molecular bonding.

Indeed, the inventors observed that simply by bringing into contact two copper elements having a certain surface state it was possible for the crystallographic structure to be transferred from one element to another.

Large monocrystalline elements, which are easily produced, are then used, and these are brought into contact with the previously manufactured element the structure of which it is desired to modify.

The method according to the present invention then enables a polycrystalline line to be transformed into a monocrystalline line. It also enables the dense planes to have a given orientation imposed on them.

The subject-matter of the present invention is then mainly a method to modify the crystalline structure of a copper element having grains of a first size and a planar surface, comprising:

a) a step of production of a copper standard having grains of a second size greater than the first size, where the said standard has a planar surface, b) a step of reducing the roughness of the planar surfaces to a roughness of less than 1 nm RMS, and advantageously less than or equal to 0.5 nm.

c) a step of cleaning the said planar surfaces, d) a step of bringing the two planar surfaces into contact, e) a step of annealing.

The method may include an additional step f) of separating the standard and the element.

For example, the element includes at least one interconnection of small area formed from grains of a first size, in which during step a) a standard is produced having at least one line of large area with at least one grain of the second size, where the area of the line of large area is greater than that of the interconnection of small area of the element to be restored, and where during step d) the interconnection of small area is brought into contact with the pad of large area.

The standard may include at least one grain the area of which is at least equal to that of the interconnection of small area, and in which, during step d), the interconnection of small area is orientated with the said grain of the line of large area.

The element may also include a lengthways-axis interconnection and the standard may be formed from a monocrystal; when the element is brought into contact with the standard the standard is orientated such that the dense planes are parallel to the interconnection axis.

The method according to the invention may include a step of application of a force to one of the elements having the effect of bringing the surfaces close to one another during the contact step.

Step b) of reduction of the roughness is obtained, for example, by mechano-chemical polishing.

Step f) is obtained, for example, by mechano-chemical planarisation, by chemical dissolution, by abrasion or by cutting. In the latter case the standard may be re-used.

The annealing temperature is, for example, between 200° C. and 400° C.

BRIEF DESCRIPTION OF THE ILLUSTRATIONS

Figure 1B:
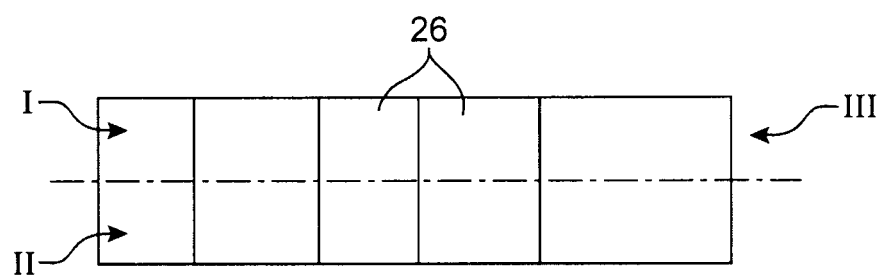
Figure 2A:
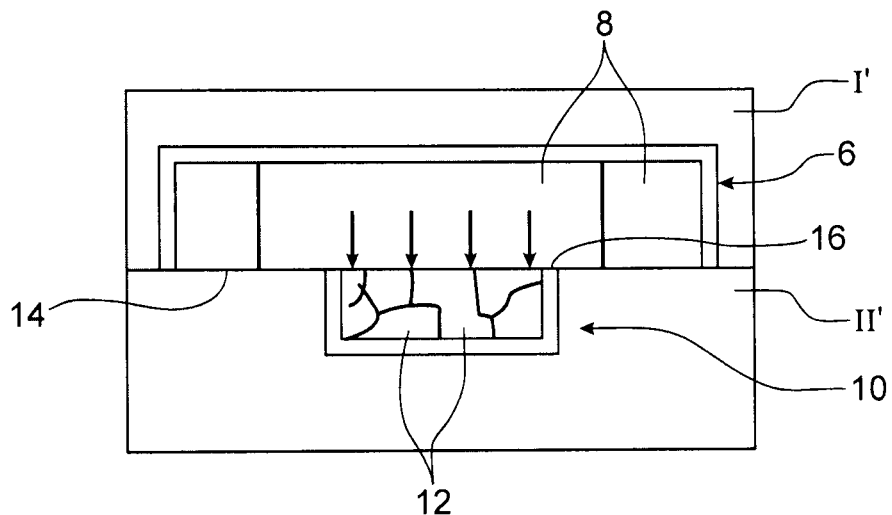
Figure 2B:
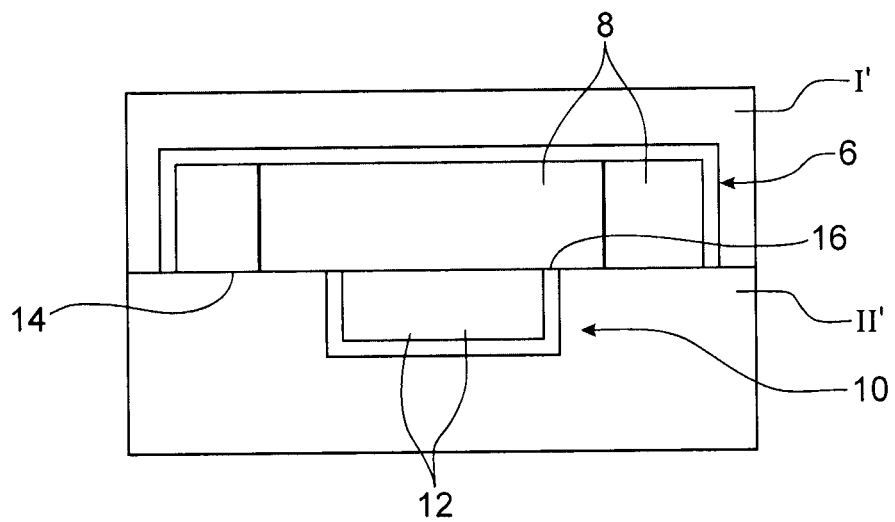
Figure 3:
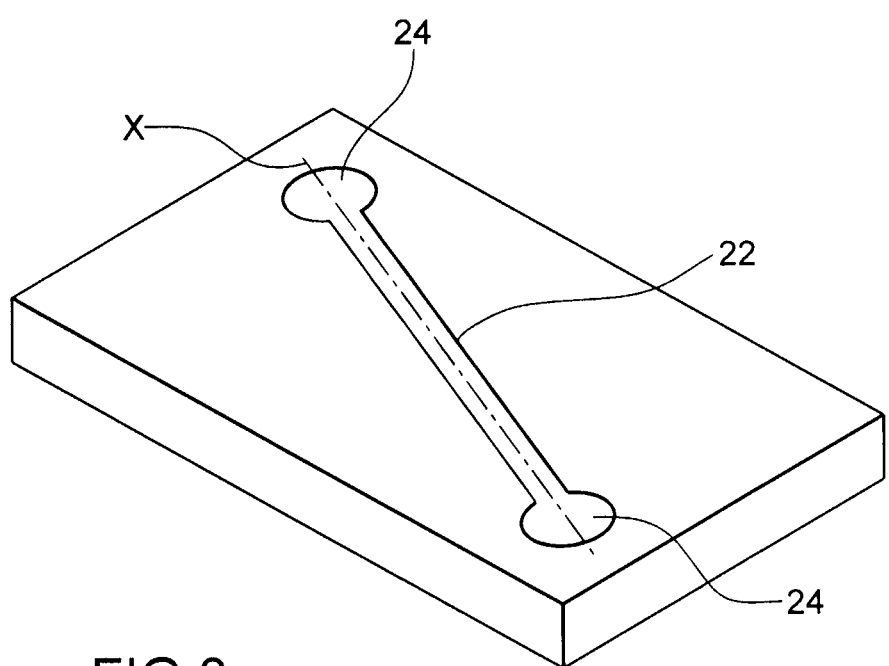

The present invention will be better understood using the description which follows and the appended illustrations, in which:

FIGS. 1A and 1B are schematic representations of a method according to the invention illustrating the modification of the crystalline structure of one copper element by another, FIGS. 2A and 2B are schematic representations of steps of a method for modifying the crystalline structure of small lines according to the present invention, FIG. 3 is a schematic representation of a copper interconnection the orientation of the dense planes of which it is desired to modify using the method according to the present invention.

DETAILED ACCOUNT OF PARTICULAR EMBODIMENTS

According to the present invention, it is desired to modify the crystalline structure of a copper element which initially has small grains, a copper element having several large grains, or a single large grain.

In the present invention the term "copper element" is understood to mean a line of copper acting as an interconnection in a plane, a via acting as an interconnection between the planes or a contact pad, or any copper element forming an electrical connection within a microelectronic structure.

According to the present invention, an element having large grains, such as those which it is desired to obtain for the element, is used. This element therefore acts as a standard the crystallographic structure of which it is desired to reproduce.

The copper element the crystalline structure of which it is desired to modify initially includes grains of a first size, and the standard includes at least one grain of a second size, larger than the first size. The grains of the element the crystalline structure of which it is desired to modify are not, of course, necessarily all of the same size, and nor are those of the standard. For the sake of simplicity, however, we consider "a first size" and "a second size". The grains of a first size will be designated by "small grains", and the grains of the second size will be designated by "large grains". In addition, the standard may include one or more grains, and the element the crystalline structure of which it is desired to modify, after implementation of the method to modify the crystalline structure, may have one or more grains.

FIGS. 1A and 1B represent steps of a method to modify the crystalline structure of a copper element according to the present invention.

It is desired to obtain from a copper element II having small grains 24 a copper element having several large grains, or a single large grain.

According to the present invention, an element I having large grains 22, such as those which it is desired to obtain for element II, is used. Element I therefore acts as a standard the crystallographic structure of which it is desired to reproduce.

Standard I may be a monocrystalline plate obtained directly by growing an ingot, or a plate with large grains obtained by undertaking a very lengthy annealing. It is also possible to generate flaws deliberately, for example dislocations, and to undertake an annealing at a temperature slightly below the fusion temperature.

Standard I may also be a layer of monocrystalline copper or a layer with large grains deposited on a substrate. For example, it is possible to use a large-grain copper layer roughly 500 nm thick; in this case the grains have a diameter of the order of 500 nm.

Standard I may also be a small strip of monocrystalline copper.

Standard I and element II each have a planar surface 2, 4 respectively, by which the two elements will be brought into contact.

During a first step, surfaces 2, 4 are polished in order to ensure very satisfactory contact between the two surfaces 2, 4. For example, the two surfaces are subject to mechano-chemical planarisation in order to attain a very low roughness of between 0 and 1 nm RMS (Root Mean Square value), and advantageously less than or equal to 0.5 nm.

During a subsequent step both surfaces 2, 4 are cleaned to remove the presence of particles due to the polishing.

During a subsequent step the two surfaces 2, 4 are brought into contact (FIG. 1A) at atmospheric pressure and at ambient temperature. The steps of planarisation and of cleaning then enable molecular contact or direct bonding between the two elements to be obtained.

Standard I and element II are then subject to an annealing step. It is not necessary to establish particular pressure conditions, since the annealing may be accomplished at atmospheric pressure.

The crystalline structure of element II is then modified, the small grains disappear and form instead large grains, which are extensions of the large grains of standard I.

The annealing step may be accomplished with or without the application of pressure on one of the elements bringing together the two surfaces 2, 4.

An element II is therefore obtained having large grains in an orientation identical to that of standard I. Standard I can then be removed by various techniques, such as for example mechano-chemical planarisation (CMP), polishing, chemical dissolution or abrasion.

It is also conceivable to separate standard I from element II in order to re-use it, for example by cutting the interface by means of a diamond blade. For example, in the case of a surface including copper lines separated by oxide zones, the copper lines protrude from the oxide zones, and the adhesion then principally occurs at the lines, and the cutting then is accomplished at these lines.

The assembly formed by standard I and element II after annealing has the properties of a single copper monobloc blank; since the contact interface has disappeared during the annealing this assembly may then be used unchanged.

In FIGS. 2A and 2B steps of a method for modifying the crystalline structure according to the present invention enabling small monocrystalline lines to be produced can be seen.

An element II' has a planar surface 16 with at least one small line 10 with small grains 12, which it is desired to transform into a monocrystalline line.

According to the present invention, a standard I" having a large line 6 with large grains 8 is used. More specifically, in the represented example, the large line 6 has at least one large grain the area 14 of which is larger than that 16 of small line 10, such that the entire surface of small line 10 is in contact with surface 14 of the large grain.

The large line with large grains of standard I' may be obtained, for example, by an annealing of very long duration.

The surface of standard I' and surface 16 of second element II" are subject to a step of planarisation so as to attain a very low roughness, less than 1 nm and advantageously less than or equal to 0.5 nm RMS, and a step of cleaning.

Standard I' and element II" are then brought into contact by surfaces 14 and 16. The large grain of large line 6 is orientated with small line 10. Direct bonding between the two surfaces then takes place.

An annealing is then applied, with or without application of pressure, which causes a modification of the crystalline structure of small line 10. The small grains grow until they form only a few large grains, or a single large grain. In the represented example line 10 has a single grain 18. There may be a step of removal of first element I". First element I" is used only to cause the formation of a monocrystalline small line 10.

In the represented example, and advantageously, large line 6 has grains of larger size than small line 10. Thus, when the crystalline structure is modified, small line 10 will be formed from a single grain, and it will therefore be monocrystalline. In this case, at the moment of contact, small line 10 is orientated with a single grain of large line 6. Advantageously, large monocrystalline lines are used. But it is clearly understood that it is equally possible to restore the small line, so that it does not have a single grain, but several large grains.

This method is particularly advantageous when it is particularly difficult to produce monocrystalline small lines directly. Thus, a large line is produced with large grains which is "transferred" to a small line with small grains.

In addition, using a standard including a large line and not an entire plate to restore the small lines has the advantage that it prevents the entire surface of the microelectronic component being brought into contact with the copper, and the contact surface is limited to that of the small line. In addition, this technique enables an entirely microelectronic method to be obtained, in manufacturing the microelectronic element and standard I'. In addition, it is easier to remove standard I'. Indeed, the silicon forming the substrate is easily removed by a chemical attack, and subsequently the oxide and the large line are removed by CMP (mechano-chemical polishing).

It is clearly understood that it is possible to restore several lines 10 of an element II' simultaneously: the planar surface of lines 10 need merely be brought into contact with the standard. If monocrystalline lines are desired each line is orientated with a grain of the standard.

The first element may be removed using various techniques, for example by mechano-chemical planarisation (CMP), polishing, chemical dissolution or abrasion, or by cutting as described above.

The size of the large lines may be greater than or equal to one tenth of a nm.

The annealing temperature for modifying the crystalline structure is dependent on the processed substrate on which the copper lines are produced, and the annealing temperature is between 200° C. and 400° C. The annealing duration is dependent on the annealing temperature: the higher temperature the shorter the annealing duration may be.

As has been previously explained, the method for modifying the crystalline structure according to the present invention enables the grains to be re-orientated in a given direction in a simple manner. It also enables the dense planes of the grains to be orientated in a given direction.

This orientation of the dense planes is particularly advantageous for circulation of current in an interconnection, which occurs in the direction of the axis of the interconnection. Indeed, electrical conductivity in the direction of the dense planes is greater than that in a direction secant to the dense planes.

In the case of a linear interconnection 22 of lengthways axis X extending between two contacts 24, as represented in FIG. 3, it is desired to have dense planes orientated roughly parallel to lengthways axis X. However, in the case of such small elements it is very difficult to accomplish a monocrystalline deposit the dense planes of which are directly orientated in the desired manner.

According to the method of the present invention a monocrystalline standard is produced with a surface which it is intended to bring into contact with the free surface of the interconnection, and the dense planes of the monocrystal of which are orientated in parallel with lengthways axis X of the interconnection.

The orientation of the dense planes in the standard is obtained by control of the process during growth of the monocrystal.

The free surface of the interconnection and the surface of the standard are subjected to a polishing as described above, in order to attain a very low degree of roughness, of between 0 and 1 nm RMS, and advantageously less than or equal to 0.5 nm RMS, and also a step of cleaning.

The two surfaces are then brought into contact and subjected to an annealing.

We shall now give an example of polishing, but this is in no sense restrictive, and any other method enabling a roughness of less than 1 nm to be attained may be used.

The contact pads or interconnections are produced by traditional microelectronic techniques of deposit and etching; since the latter are well known to the skilled man in the art they will not be described in greater detail.

A mechano-chemical polishing or CMP (Chemical Mechanical Polishing) is undertaken, to level the surfaces intended to be brought into contact.

The surfaces to be polished are rubbed on a fabric called a "pad" consisting of viscoelastic porous polyurethane and the properties of which (hardness, compressibility, shape and dimension of the pores and of the patterns, etc.) depend on the nature of the material to be polished. The material(s) of the surfaces is (are) torn off by chemical reaction and mechanical action using the fabric and/or a polishing solution containing particles, also called a "slurry" (particles in suspension in an acidic or basic chemical solution). These slurries can consist of particles of nanometric sizes in a liquid solution (colloidal solution, micelle solution, Langmuir-Blodget solution, etc.).

The polishing is obtained through a combination of several actions:
  a mechanical action obtained by rubbing the fabric and/or the slurry particles on the surface. The speed of removal of the material has been modelled by Preston in the following equation:

$$RR = K_p * P * V \qquad [1]$$

where:
RR (Removal Rate): rate of removal at a given point (nm/min),
$K_p$=Preston's constant taking into account the characteristics of the material, the fabric, the type of abrasive, the temperature, etc.
P=Applied pressure (Newton),
V=Linear speed of a point of the plate relative to the fabric (m/s),
  a chemical action; during polishing it is desired to polish simultaneously copper and the dielectric material. The slurries are therefore suitable to have a chemical action on the copper and on the dielectric material. Concerning the copper, the chemical action generally results from an attack with an acid and/or an oxidiser allowing a reaction with the surface to be polished to take place.

A slurry generally contains a chemical agent which attacks metals, an oxidiser (generally $H_2O_2$), a pH-stabilising agent added to the acidic or basic solution of the slurry, and a corrosion inhibitor. The chemical solution will passivate (K1) the material by forming with its surface a metallic oxide which will be removed mechanically (K2) by the fabric, and by the slurry particles, if applicable. The chemical solution will then be formed of $CuO_X$.

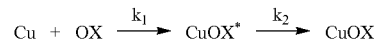

This chemical reaction facilitates and accelerates the polishing mechanism. Other chemical reactions can be engendered through the formation of soluble copper/copper⁺ or copper/$Cu^{2+}$ metallic cations, and these can be removed from the surface to be polished by the fabric and/or the slurry particles.

In respect of the dielectric material, the slurries used are generally aqueous solutions. Water is of great importance for dielectric polishing, for example of a silicon oxide. Two chemical reactions are involved.

Firstly, the water penetrates under the effect of the pressure, and breaks some Si—O bonds of the silicon oxide to form a hydrated surface. Separation of the (Si—O—Si) bonds is controlled by the diffusion of the water in the silicon dioxide. The polishing is undertaken when the following reversible hydration reaction (polymerisation):

$$(SiO_2)_X + 2H_2O \leftrightarrow (SiO_2)_{X-1} + Si(OH)_4$$

can occur in the reverse direction, i.e. in the direction of hydration (depolymerisation), as notably described in the work Handbook of Semiconductor Interconnection Technology by GC Schwarz.

The movement of the fabric relative to the silicon plate then enables the slurry particles to be torn from the surface, thus removing atoms of the surface material.

In order to effect a chemical attack at once of the copper and of the dielectric material, it is possible to use an aqueous solution obtained by solubilisation in deionised water:

of one or two complexing agents or metal etching agents, and of the metal compounds (glycine, NH3, EDTA, etc.), if applicable, which enables the copper polishing speed to be increased, of a copper corrosion inhibitor (benzotriazole BTA, triazole TA, etc.), an agent passivating the copper film reduces the polishing speed specifically in the lower areas to be leveled. Two inhibitors are often used, of a surfactant to stabilise the pH, improve the selectivity of polishing of the copper relative to the other materials used, etc.

of an oxidising agent ($H_2O_2$, $KIO_3$, hydroxylamine, etc.) which, depending on the pH and/or its concentration, can form either a passivation of the copper by an insoluble copper oxide or hydroxide, or a corrosion by a metallic cation which is soluble in the aqueous solution, anionic or cationic colloidal particles, having a pH of between 1 and 12, are advantageously added to obtain a stable suspension of particles. The particles can be pure such as silicon dioxide, carbon, cerium oxide, alumina or polymers. The sizes of the elementary particles will be determined by the solutioning method chosen. They may vary from 3 nm to 300 nm in size. The percentage by mass of particles in the aqueous solution may be between a few ppm and 50%.

As an example, the following aqueous solutions may be used:

Klebosol CuS1351®, sold by the company Rohm & Haas: 12% by mass of particles of silicon dioxide of diameter 70 nm, of pH 10, anionic, or T605® sold by the company Hitachi Chemical: 0.1% by mass of particles of silicon dioxide of diameter 90 nm, of pH 6.5, anionic.

The characteristics of the polishing fabrics used notably depend on the dimensions of the cavities made in an insulating material and filled with copper, with or without a diffusion barrier or bonding layer.

In the case of cavities wider than 10 μm, polyurethane fabrics known as "flattening fabrics" are chosen, with a "shore D" hardness of 50 to 70, of a density of 60 to 90 mg/$cm^3$, and of a compressibility of less than 4%, for example IC1000 from the company Rohm & Haas.

In the case of cavities smaller than 10 μm, "medium" fabrics are chosen, with a "shore A" hardness of 50 to 70, a density of 20 to 40 mg/$cm^3$, and a compressibility of between 10 and 25%. For this application, for example Suba IV from the company Rohm & Haas.

In the case of cavities of the order of one micrometer in size, since certain ductile materials may be scratched by the particles, polishing fabrics known as "finish polishing fabrics" are preferred, with a "shore A" hardness of 50 to 80, a density of <20 mg/$cm^3$, and a compressibility of >30%, for example POLITEX® from the company Rohm & Haas, or fabrics of the Fujibo® brand.

The elements are, for example, processed on traditional polishing machines, for example of the Mirra or Reflexion types, from Applied Materials USA, Megapol M550 from Alpsitec France or FREX from Ebara Japon.

The polishing parameters are the pressing pressure applied to the substrate, of 0.02 daN/$cm^2$ to 1 daN/$cm^2$, the speed of a point of the substrate relative to a point of the fabric is between 0.1 m/s to 3 m/s, the flow rate of the aqueous solution between 5 and 300 ml in the case of substrates varying from 1 to 450 mm, and the temperature is between 2 and 70° C. The conditions for the abovementioned applications are preferentially 0.1 daN/$cm^2$, with a speed of 1 m/s, an aqueous solution flow rate of 150 ml for substrates of 200 mm at a temperature of 52° C.

The method according to the present invention therefore notably enables the crystalline structure of small copper elements to be transformed, advantageously in order to obtain monocrystalline elements which are difficult to obtain directly during deposit. Modification of the crystalline structure according to the present invention also enables the dense planes to be orientated in a given direction so as to improve electrical conductivity.

The method according to the present invention applies in particular to the elements of microelectronic devices, such as, for example, contact pads, interconnection lines or vias. It is clearly understood, however, that it is not restricted to such an application, and that the method according to the invention can be used in annealings of temperatures higher than 400° C. in other fields of application.

The invention claimed is:

1. A method for modifying a crystalline structure of a copper element with a planar surface, the method comprising:

a) producing a copper standard having grains of a second size, the standard having a planar surface;

b) reducing roughness of the planar surface of the copper standard and the planar surface of a copper element to a roughness of less than 1 nm RMS, said copper element having grains of a first size;

c) cleaning the planar surfaces of said copper standard and of said copper element obtained from said b) reducing;

d) contacting the cleaned planar surfaces of said copper standard and said copper element; and e) annealing the copper standard and the copper element after said d) contacting, thereby growing the size of the grains of the copper element until these grains reach the size of the grains of the copper standard, and thereby forming a monobloc of copper from the copper standard and the copper element with no bonding interface between the copper standard and the copper element, wherein said grains of a second size are greater in size than the grains of a first size.

2. A method according to claim 1, in which the roughness upon completion of said b) reducing is less than or equal to 0.5 nm.

3. A method according to claim 1, further comprising f) separating the standard and the element.

4. A method according to claim 1, wherein
the first section of the copper element is present along a lengthways axis of the copper element,
the standard is formed from a monocrystal having grains of a second size, and
when the element is brought into contact with the standard, the standard is orientated such that dense planes are parallel to the axis of the second.

5. A method according to claim 1, further comprising applying a force to one of the elements to bring surfaces close to one another during said d) contacting.

6. A method according to claim 1, in which in the reducing b) roughness is undertaken by mechano-chemical polishing.

7. A method according to claim 3, in which the separating f) is obtained by mechano-chemical planarization, by polishing, chemical dissolution, abrasion, or cutting.

8. A method according to claim 1, in which the annealing temperature is between 200° C. and 400° C.

9. A method according to claim 1, in which the annealing temperature is between 200° C. and less than 400° C.

10. A to claim 1,
A method for modifying a crystalline structure of a copper element with a planar surface, the method comprising:
a) producing a copper standard having grains of a second size, the standard having a planar surface;
b) reducing roughness of the planar surface of the copper standard and the planar surface of a copper element to a roughness of less than 1 nm RMS, said copper element having grains of a first size;
c) cleaning the planar surfaces of said copper standard and of said copper element obtained from said b) reducing;
d) contacting the cleaned planar surfaces of said copper standard and said copper element; and
e) annealing the copper standard and the copper element after said d) contacting, thereby growing the size of the grains of the copper element until these grains reach the size of the grains of the copper standard, and
thereby forming a monobloc of copper from the copper standard and the copper element with no bonding interface between the copper standard and the copper element,
wherein said grains of a second size are greater in size than the grains of a first size,
wherein the copper element has a first section having an area formed from grains of a first size, and
wherein, the standard that results from said producing a) has a second section having a grain of a second size, the area of the second section being greater than the area of the first section of the copper element, and
wherein, during said d) contacting, the second section is brought into contact with the first section.

11. A method according to claim 10, wherein
the copper standard further comprises at least one further section having an area that is at least equal to the area of the first section, and
during said d) contacting, the first section is orientated with the grain of the second section.

* * * * *